United States Patent
Iizuka et al.

(10) Patent No.: US 9,136,406 B2
(45) Date of Patent: Sep. 15, 2015

(54) SOLAR CELL ASSEMBLY WITH DIFFRACTION GRATINGS

(75) Inventors: Hideo Iizuka, Ann Arbor, MI (US); Yasuhiko Takeda, Aichi (JP); Hisayoshi Fujikawa, Seto (JP)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 893 days.

(21) Appl. No.: 12/831,587

(22) Filed: Jul. 7, 2010

(65) Prior Publication Data

US 2012/0006404 A1  Jan. 12, 2012

(51) Int. Cl.
  *H01L 31/0236* (2006.01)
  *H01L 31/0232* (2014.01)
  *H01M 14/00* (2006.01)

(52) U.S. Cl.
  CPC .... *H01L 31/02325* (2013.01); *H01L 31/02366* (2013.01); *H01M 14/005* (2013.01); *Y02E 10/542* (2013.01)

(58) Field of Classification Search
  CPC .... G02B 5/1804; G02B 5/1809; H01G 9/209; H01L 31/02327; H01L 31/02366; H01L 51/447
  See application file for complete search history.

(56) References Cited

U.S. PATENT DOCUMENTS

| | | | |
|---|---|---|---|
| 4,204,933 A * | 5/1980 | Barlow et al. | 438/72 |
| 4,331,972 A * | 5/1982 | Rajchman | 348/795 |
| 6,858,462 B2 | 2/2005 | Zaidi et al. | |
| 6,936,761 B2 * | 8/2005 | Pichler | 136/256 |
| 2005/0072458 A1 * | 4/2005 | Goldstein | 136/251 |
| 2006/0130895 A1 * | 6/2006 | Gaudiana et al. | 136/263 |
| 2008/0115828 A1 * | 5/2008 | Taylor | 136/256 |
| 2009/0266415 A1 * | 10/2009 | Rothrock et al. | 136/256 |
| 2009/0266418 A1 | 10/2009 | Hu et al. | |

OTHER PUBLICATIONS

Exploratorium. "Diffraction: Waves & Light Science Project" http://www.exploratorium.edu/snacks/diffraction/index.html Retrieved Sep. 8, 2013.*

Polyanskiy (Refractive index database, http://refractiveindex.info. Accessed Oct. 3, 2014).*

Yasuhiko Takedo, Monolithically series-interconnected transparent modules of dye-sensitized solar cells, Solar Energy Materials & Solar Cells 93 (2009), pp. 808-811.

Naohiko Kato, Degradation analysis of dye-sensitized solar cell module after long-term stability test under outdoor working condition, Solar Energy Materials & Solar Cells 93 (2009), pp. 893-897.

Toshiyuki Sano, Monolythically series-interconnected modules of dye-sensitized solar cells 1: Large-sized modules for practical uses, Renewable Energy 2006 Proceedings, pp. 349-352.

(Continued)

*Primary Examiner* — Matthew Martin
*Assistant Examiner* — Magali P Slawski
(74) *Attorney, Agent, or Firm* — Christopher G. Darrow; Darrow Mustafa PC

(57) ABSTRACT

A solar cell structure using either a dye-sensitized or organic absorber is provided with a diffraction grating on at least one side to enhance the travel of first order diffraction components through the photo sensitive material. A two-sided cell uses diffraction gratings both top and bottom wherein the periodic diffraction elements of one grating are shifted by one-quarter of the grating period relative to the other.

13 Claims, 4 Drawing Sheets

(56) References Cited

OTHER PUBLICATIONS

Saleem H. Zaidi, Diffraction Grating Structures in Solar Cells, IEEE 2000, pp. 395-398.

Christoph Winder, Low bandgap polymers for photon harvesting in bulk heterojunction solar cells, J. Mater Chem., 2004, 14, pp. 1077-1086.

* cited by examiner

SOLAR CELL ASSEMBLY WITH DIFFRACTION GRATINGS

FIELD OF THE INVENTION

This invention relates to solar cells and more particularly to solar cells of the dye-sensitized or organic absorber types using diffraction gratings to create oblique first order diffraction mode components which traverse the absorber thereby to enhance efficiency of the cell.

BACKGROUND OF THE INVENTION

Solar cells of various types have been developed for the purpose of converting unpolarized sunlight into electrical energy. Major objectives of solar cell research are increased efficiency and reduced production costs. Solar cells using dye-sensitized photoelectrodes and/or organic absorbers are substantially less expensive to manufacture than the conventional crystalline silicon solar cells.

BRIEF SUMMARY OF THE INVENTION

The first aspect of the present invention is a solar cell assembly of improved efficiency resulting from the combination of solar cell and diffraction grating technologies. As further described herein, the solar cell may be of the dye-sensitized or organic types and the diffraction grating may take the form of one or more substrates of glass or other optically transparent material bonded to one or both of the electrode layers on opposite sides of a photocell and exhibiting a pattern of diffraction grating material such as $TiO_2$ embedded in the surface of the transparent material at the electrode boundary. The grating is structured to couple only the first order diffraction component of normal incident light.

According to a second aspect of the invention, we have discovered that it is possible to advantageously combine solar cell technology with a bilateral diffraction grating technology as described in the co-pending application for U.S. patent Ser. No. 12/692,688 filed Jan. 25, 2010 by Hideo Iizuka and Nader Engheta, the complete disclosure of which is incorporated herein by reference.

In accordance with our discovery, diffraction gratings using substrates with periodically arranged diffraction grating materials embedded therein are placed on opposite sides of a two-sided solar cell such that unpolarized light is incident on both such sides. The periodicities of the two gratings are the same but one grating is shifted by a fraction, preferably one-quarter, of the period relative to the grating materials in the other of the two gratings, thereby to prevent the escape of oblique diffraction components traveling through the photocell and returning those components for a second pass through the photocell. This has been found to enhance the efficiency of dye-sensitized and organic absorber type photocells.

BRIEF DESCRIPTION OF THE DRAWINGS

The description herein makes reference to the accompanying drawings wherein like reference numerals refer to like parts throughout the several views and wherein.

DETAILED DESCRIPTION OF THE ILLUSTRATIVE EMBODIMENT

Figure 1:
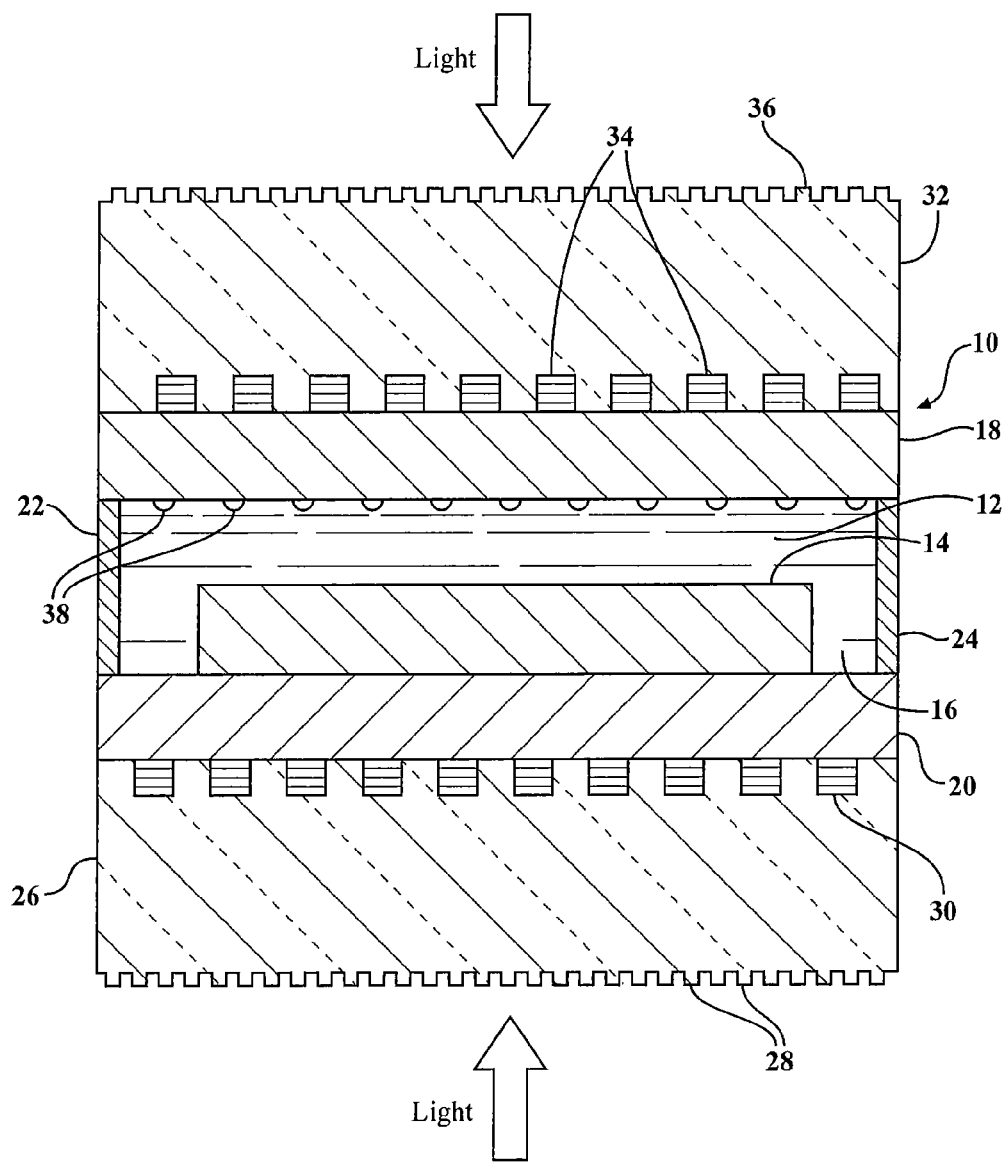
FIG. 1 is a cross-sectional view of a first solar cell assembly employing the invention.

Referring now to the drawings and particular to FIG. 1, there is shown a solar cell assembly 10 comprising a photo-electrolytic cell 12 containing a dye-sensitized photoelectrode having a light absorbing layer 14 in an electrolyte 16. The top boundary of the cell 24 is defined by a positive electrode 18 and the bottom side of the cell is defined by a negative electrode 20. Resin seals 22 close the sides of the electrolyte cell volume. The electrodes 18, 20 may be fluorine-doped tin dioxide ($SnO_2$:F) and the photoelectrode may be dye-sensitized titanium dioxide ($TiO_2$).

A lower diffraction grating is defined by a glass substrate 26 having a periodic arrangement of rectangular grooves formed in the surface thereof which is bonded to and forms an optical boundary with the fluorine-doped tin dioxide electrode 20. The grooves are filled with titanium dioxide ($TiO_2$) to form diffraction elements 30. An optically transparent plastic may be substituted for glass in the fabrication of the substrate 26. The surface on which light is incident from below the solar cell assembly 10 is modified by a shallow, low periodicity rectangular groove pattern constituting an anti-reflection grating 28 to provide an anti-reflection property.

A second diffraction grating made up of a glass substrate 32 with periodic titanium dioxide element 34 is bonded to the upper electrode 18 and the light incident upper surface 36 is modified to exhibit an anti-reflection grating-36.

As indicated in FIG. 1, the diffraction grating elements 30 of the lower substrate 26 are shifted by one-quarter of the geometric spacing period of the diffraction grating elements 34 in the upper substrate 32, thus to perform an optical blocking function as is more fully described in the aforesaid pending application Ser. No. 12/692,688.

It is apparent from the foregoing that each of the gratings in the assembly of FIG. 1 consists of a periodic structure including $TiO_2$ rectangular elements filling periodic grooves in glass at the interface of the glass with the fluorine-doped tin dioxide electrodes. Unpolarized sunlight through the glass is diffracted mainly into the oblique first order diffraction mode resulting in the enhancement of the path of travel of that diffraction component through the light absorbing layer 14 of the titanium dioxide, dye-enhanced photoelectrode immersed in the electrolyte 16. The advantage to the double-sided arrangement of FIG. 1 is the fact that, with the quarter prior shift between the diffraction grating elements 30, 34 of the two substrates 26, 32, unpolarized sunlight from both sides experiences the path enhancement. Note that, unlike the device described in the aforementioned application Ser. No. 12/692,688, the shifted gratings here are fixed.

The fabrication process for the structure in FIG. 1 involves the creation of the periodic grooves in the glass substrates 26, 32, the filling of the grooves with titanium dioxide and the bonding of the resulting structure to the fluorine-doped tin dioxide electrodes 18, 20. The grating period is an order of wavelength to achieve oblique diffraction whereas the metric periods of the anti-reflection surfaces 28, 36 are much smaller. Platinum particles 38 are bonded to the inside surface of the electrode 18; i.e., the surface which is within the interior of the cell.

The glass components and the electrolyte in the structure of FIG. 1 has a refractive index of 1.5 while the absorbing layer and the tin dioxide electrodes have a refractive index of about 2. The refractive index of titanium dioxide is 2.38. The overall design has the following specification: period (P) of grating elements is 0.84λ to 0.9λ; fill factor (R) is 0.34 to 0.44; height (H) of the grating elements is 0.59λ, to 0.69λ. The refractive index of the diffraction gratings 30, 34 is larger than those of the light absorbing layer 14, electrolyte 16, and electrodes 18, 20. For more details, see our co-pending application Ser. No. 12/638,334 filed Dec. 15, 2009 the content of which is incorporated herein by reference. Where λ is 750 nm, the period P is 655 nm or 0.87λ, the edge width is 255 nm, the fill factor is 0.39 and the grating height is 480 nm or 0.64λ.

Figure 4:
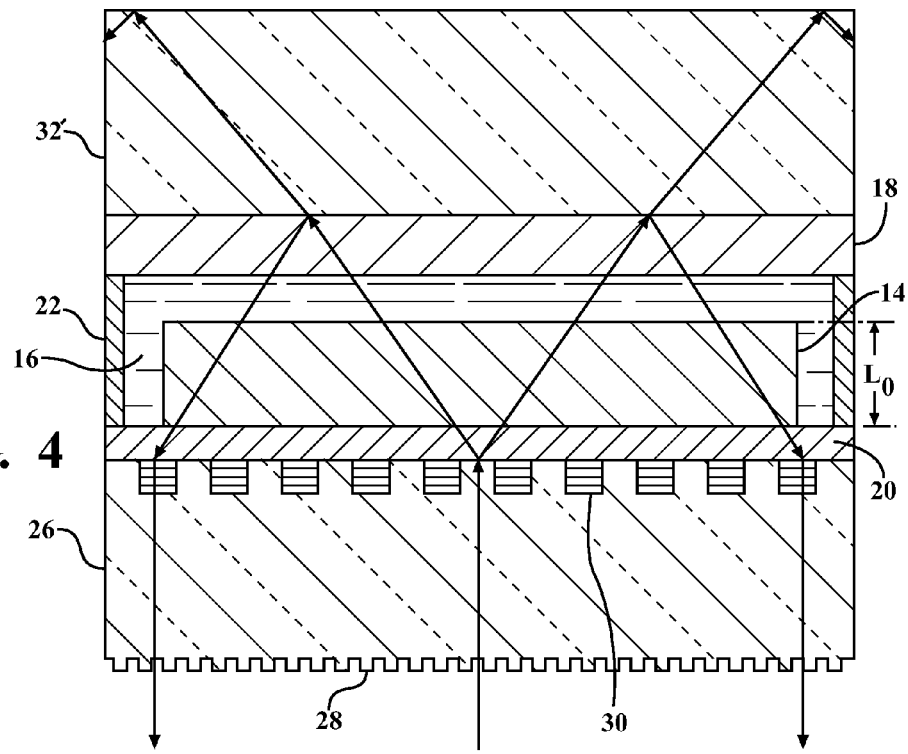
FIG. 4 is a diagram illustrating the enhancement effect to first order diffraction components.
Figure 5:
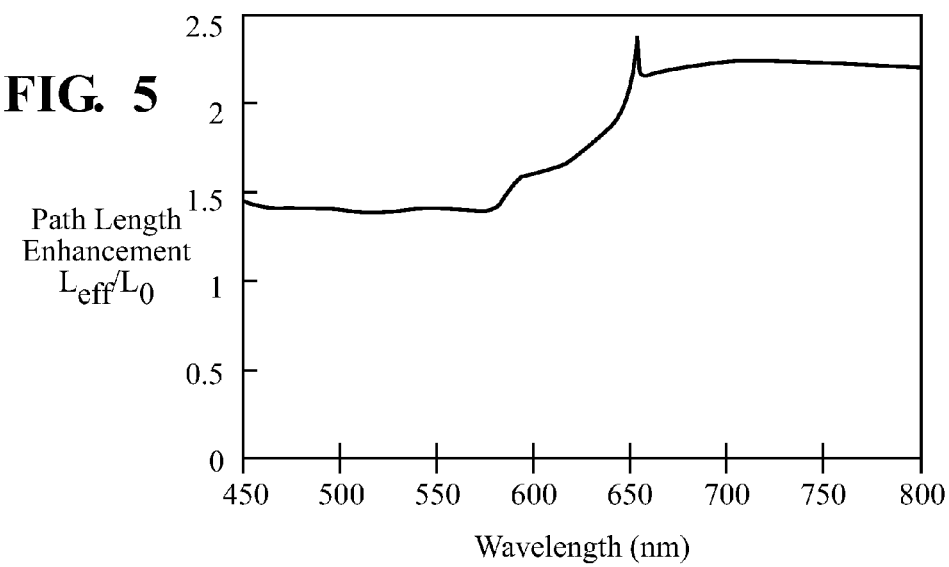
FIG. 5 is a graph of wavelength vs. path length enhancement effects in the solar cells described herein.

FIG. 4 illustrates how the grating couples only the first order component of normal incident light into the cell. FIG. 5 illustrates the optical path enhancement realized in the solar cell assembly 10 of FIG. 1 FIG. 4. The vertical axis represents the effective path length relative to the thickness of the light absorbing layer 14. The optical path is calculated in one round trip; i.e., bottom to top and back to bottom. As shown in FIG. 5, path length enhancement of 2 is achieved from 650 nm to 800 nm with an average enhancement value of 1.8 over the wavelength range from 450 nm to 800 nm.

Figure 2:
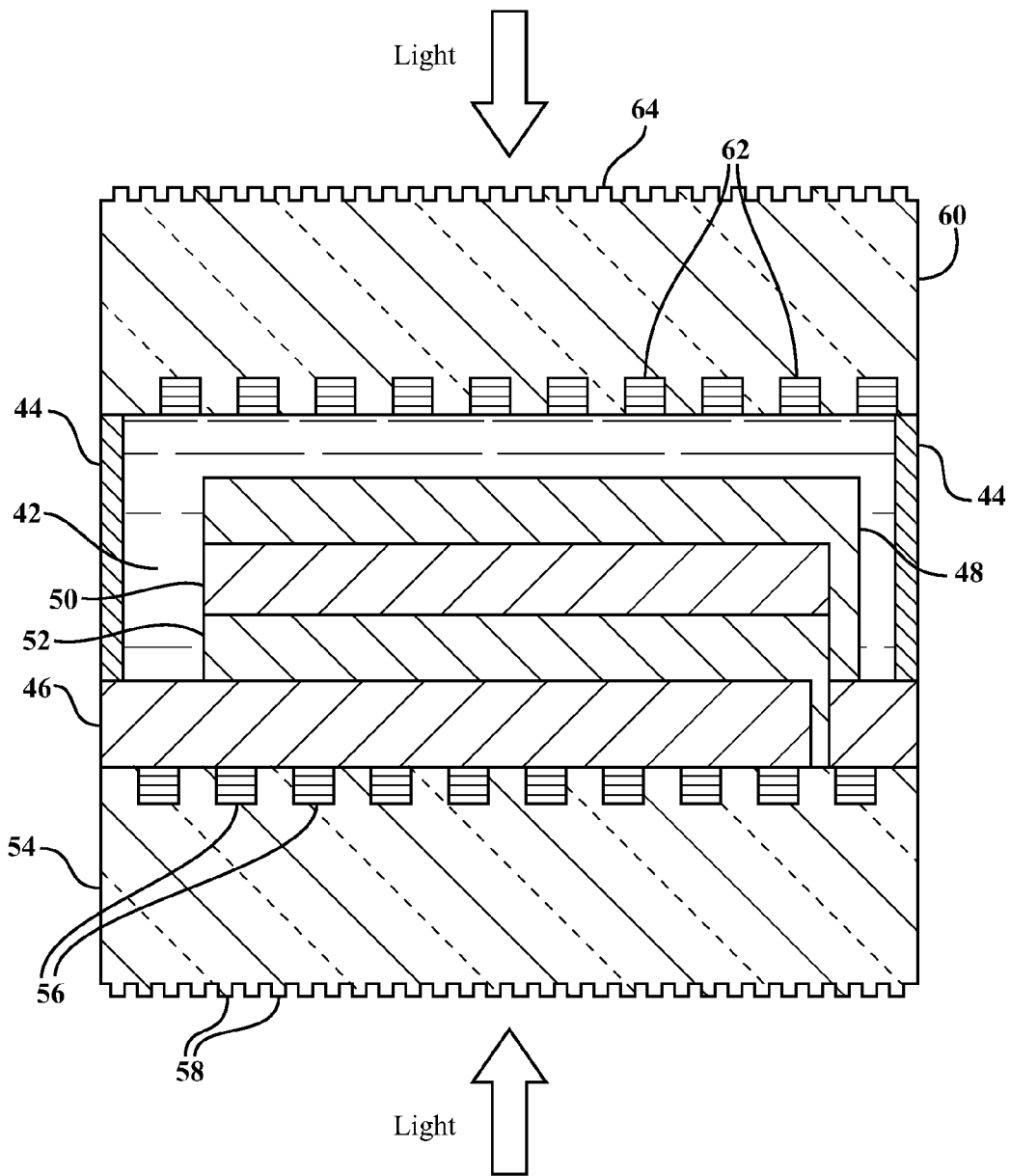
FIG. 2 is a cross-sectional diagram of a second solar cell assembly embodying the invention.

Referring now to FIG. 2, a second configuration for a dye-sensitized solar assembly 40 is shown. A cell filled with electrolyte 42 has sealed edges 44 to define an electrolytic cell containing a dye-sensitized titanium dioxide photoelectrode/ light absorbing layer 52. A negative electrode 46 made of fluorine-doped tin dioxide forms a partial boundary layer and an L-shaped positive electrode 48 separated from the dye-sensitized electrode/light absorbing layer 52 by a silicon dioxide separator 50 forms the rest of the lower boundary. The physical configuration of coplanar but laterally opposite positive and negative electrodes in the structure of FIG. 2 enhances the ability to serialize solar cells electrically in side-by-side physical relationship.

The structure of FIG. 2 further comprises a glass substrate 54 with titanium dioxide periodically arranged grating elements 56 therein and exhibiting finely grooved pattern 58 for anti-reflection properties.

The top side of the structure shown in FIG. 2 comprises an upper glass substrate 60 with a periodic arrangement of grating elements 62 as well as a reflection reducing top pattern structure 64. Again, the refractive index of the diffraction grating elements 56, 62 is greater than those of the absorbing layer, electrolyte, and electrodes.

The electrode 48 may use as a material of construction $In_2O_3$:Sn+Pt or carbon. If carbon is used, the platinum element may be omitted.

The solar cell structure of FIG. 2 functions essentially as described above with reference to FIG. 1. FIG. 4 illustrates the enhancement of the first order diffraction component travel path through the photoelectric cell and infers the increased efficiency which is possible as a result of this structure. As also explained above, the two-sided nature of the structure affords enhancement with respect to incident unpolarized sunlight from each of two directions.

Figure 3:
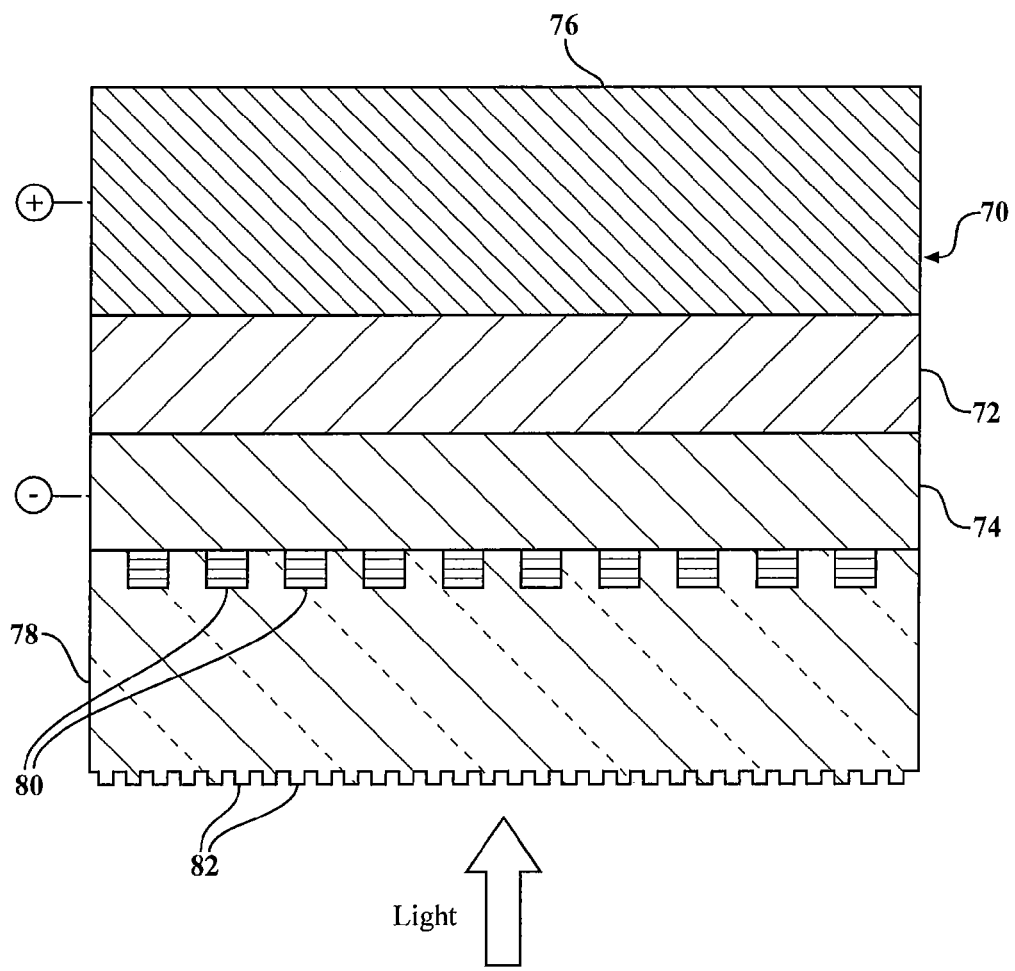
FIG. 3 is a cross-sectional diagram of still a third photocell assembly or a portion thereof embodying an aspect of the invention.

FIG. 3 illustrates a still further embodiment of the invention in the form of a grating enhanced solar cell structure 70 including an organic absorber layer 72 (functionally analogous to the light absorbing layer 14) bonded to an indium tin oxide negative electrode 74 on one side and to an aluminum positive electrode 76 on the opposite side. Glass diffraction layer 78 with periodic titanium dioxide diffraction grating elements 80 is bonded to the indium tin oxide electrode 74 and preferably modified on the light incident surface to exhibit the low metric period grating grooves of the anti-reflection grating 82. Enhancement of first order component travel path through the organic absorber layer 72 is also realized in the structure of FIG. 3.

Various modifications and additions to the invention will occur to persons skilled in the art. By way of example, the substrate 32 in a single-sided embodiment having no diffraction grating elements 34 can be composed of a polymeric film or plate. The substrate 26 having diffraction grating elements 30 can also be composed of a transparent polymeric plate. The typical thickness of the substrates 26, 32 is from 0.5 mm to 5 mm. The titanium dioxide in the light absorbing layer 14 can be replaced by ZnO or $SnO_2$. The titanium dioxide grating material can also be replaced with $Ta_2O_5$, $ZrO_2$, or $Nb_2O_5$, all of which have a refractive index greater than 2. In addition, the geometry of the diffraction grating elements 30, 34, 56, 62 and 80 is not necessarily rectangular but may also be triangular or "blazed".

What is claimed is:

1. A solar cell assembly responsive to a component of incident light, the component having wavelength λ, the solar cell comprising:
    a cell containing a photoelectric absorber selected from the group consisting of a dye-sensitized photoelectrode and an organic absorber;
    a first electrode of a first polarity located on one side of the photoelectric absorber;
    a second electrode of a second polarity located on the opposite side of the photoelectric absorber and having a refractive index of about 2; and
    a diffraction grating comprising an optically transparent substrate with a refractive index of about 1.5 and periodically arranged dielectric grating elements with a refractive index greater than the refractive index of the photoelectric absorber, the grating elements embedded in the transparent substrate on one side of the cell, the grating elements having a periodicity of about 0.84λ to about 0.9λ and a height of about 0.59λ to 0.69λ;
    wherein λ is within a range of 450 nm to 800 nm, and wherein the dielectric grating elements are located at an interface between the optically transparent substrate and either of the first or second electrode.

2. The solar cell assembly as defined in claim 1 wherein the dielectric grating elements are made of a material selected from the group consisting of $TiO_2$, $Ta_2O_5$, $ZrO_2$ and $Nb_2O_5$.

3. The solar cell assembly as defined in claim 1 wherein the first and second electrodes are made of fluorine-doped tin dioxide ($SnO_2$:F).

4. The solar cell assembly as defined in claim 1 wherein the cell contains an electrolyte.

5. The solar cell assembly as defined in claim 1 wherein a surface of the optically transparent substrate upon which light is incident is modified to create an anti-reflection characteristic.

6. The solar cell assembly as defined in claim 5 wherein the modification comprises an anti-reflection grating of periodicity higher than the periodicity of the diffraction grating thereby to act as an anti-reflection coating.

7. The solar cell as defined in claim 1 wherein the grating elements are arranged on a surface of the substrate that is adjacent to one of said first and second electrodes.

8. The solar cell assembly as defined in claim 1 wherein λ is about 750 nm.

9. A bilateral solar cell assembly responsive to a component of incident light having wavelength, $\lambda$, the bilateral solar cell assembly comprising:
- a subassembly having:
  - a light absorbing layer with a refractive index of about 2;
  - a first electrode that is substantially transmissive toward the component of light and contacting the light absorbing layer, the first electrode disposed at a first surface of the subassembly;
  - a second electrode in electrical communication with the light absorbing layer; and
  - a second surface opposite the first surface;
- a first diffraction grating comprising:
  - a first optically transparent substrate having a refractive index of about 1.5; and
  - a first plurality of periodic grating elements characterized by a refractive index greater than the refractive index of the light absorbing layer, a periodicity of about $0.84\lambda$ to about $0.9\lambda$, a fill factor of about 0.34 to 0.44 and a height of about $0.59\lambda$ to $0.69\lambda$, the first plurality of periodic grating elements disposed at an interface between the first optically transparent substrate and the first surface of the subassembly; and
- a second diffraction grating comprising:
  - a second optically transparent substrate having a refractive index of about 1.5;
  - a second plurality of periodic grating elements characterized by a refractive index, a periodicity, a fill factor and a height substantially identical to those of the first plurality of periodic grating elements, the second plurality of periodic grating elements disposed at an interface between the second optically transparent substrate and the second surface of the subassembly;

wherein $\lambda$ is within a range of 450 to 800 nm.

10. The solar cell assembly as defined in claim 9 wherein the light absorbing layer is a dye-sensitized photoelectrode.

11. The solar cell assembly as defined in claim 10 wherein the subassembly comprises an electrolyte in contact with the light absorbing layer and the second electrode, thereby to facilitate electronic communication between the light absorbing layer and the second electrode.

12. The solar cell assembly as defined in claim 9 wherein $\lambda$ is about 750 nm.

13. The solar cell assembly as defined in claim 9 wherein the second diffraction grating is shifted laterally relative to the first diffraction grating by about one-quarter of the periodicity.

* * * * *